(12) United States Patent
Lien et al.

(10) Patent No.: US 12,538,832 B2
(45) Date of Patent: Jan. 27, 2026

(54) POWER CHIP PACKAGING STRUCTURE

(71) Applicant: TONG HSING ELECTRONIC INDUSTRIES, LTD., Taipei (TW)

(72) Inventors: Chung-Hsiao Lien, Taipei (TW); Wei-Ming Lu, Taipei (TW); Jia-Yi Wu, Taipei (TW); Zzu-Chi Chiu, Taipei (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 406 days.

(21) Appl. No.: 18/209,851

(22) Filed: Jun. 14, 2023

(65) Prior Publication Data
US 2024/0282727 A1 Aug. 22, 2024

(30) Foreign Application Priority Data
Feb. 17, 2023 (TW) ................. 112105901

(51) Int. Cl.
H01L 23/00 (2006.01)
H01L 23/498 (2006.01)

(52) U.S. Cl.
CPC ............. *H01L 24/05* (2013.01); *H01L 24/04* (2013.01); *H01L 24/48* (2013.01); *H01L 24/49* (2013.01); *H01L 23/49838* (2013.01); *H01L 2224/04042* (2013.01); *H01L 2224/05541* (2013.01); *H01L 2224/05553* (2013.01); *H01L 2224/05554* (2013.01); *H01L 2224/05578* (2013.01); *H01L 2224/05583* (2013.01); *H01L 2224/05647* (2013.01); *H01L 2224/48095* (2013.01);
(Continued)

(58) Field of Classification Search
CPC ... H01L 23/49838; H01L 24/05; H01L 24/04; H01L 24/48; H01L 24/49; H01L 2224/04042; H01L 2224/05541; H01L 2224/05553; H01L 2224/05554; H01L 2224/05578; H01L 2224/05583; H01L 2224/05647; H01L 2224/48095; H01L 2224/48106; H01L 2224/48227; H01L 2224/49111
USPC ......................................... 257/678
See application file for complete search history.

(56) References Cited

U.S. PATENT DOCUMENTS 9,196,562 B2 * 11/2015 Siepe .................. H01L 23/3735
9,397,017 B2 7/2016 Lin et al.
(Continued)

FOREIGN PATENT DOCUMENTS

CN 111106084 B 8/2021

*Primary Examiner* — Jasmine J Clark
(74) *Attorney, Agent, or Firm* — Birch, Stewart, Kolasch & Birch, LLP

(57) ABSTRACT

A power chip packaging structure includes: a ceramic substrate; a first and a second top metal layers are formed on the ceramic substrate; a bottom metal layer formed on the ceramic substrate; a power chip having an active surface and a chip back surface. The active surface has a contact pad, and the chip back surface is connected to the first top metal layer. One or more first copper layers are formed on the contact pad, a top surface of the first copper layer has a peripheral region and an arrangement region surrounded by the peripheral region. Multiple second copper layers are formed in the arrangement region and separated from each other. Each of multiple wires is respectively connected to the second copper layer with one end and connected to the second top metal layer with the other end.

20 Claims, 4 Drawing Sheets

(52) U.S. Cl.
CPC ............... *H01L 2224/48106* (2013.01); *H01L 2224/48227* (2013.01); *H01L 2224/49111* (2013.01); *H01L 2224/49175* (2013.01)

(56) References Cited

U.S. PATENT DOCUMENTS

| | | |
|---|---|---|
| 9,468,091 B2 | 10/2016 | Wei et al. |
| 9,484,315 B2 | 11/2016 | Lin et al. |
| 10,743,411 B1 | 8/2020 | Yu et al. |

\* cited by examiner

POWER CHIP PACKAGING STRUCTURE

CROSS-REFERENCE TO RELATED APPLICATION

This non-provisional application claims priority under 35 U.S.C. § 119(a) to Patent Application No. 112105901 filed in Taiwan, R.O.C. on Feb. 17, 2023, the entire contents of which are hereby incorporated by reference.

BACKGROUND

Technical Field

The instant disclosure relates to a power chip packaging structure.

Related Art

For a power chip packaging structure known to the inventor, the aluminum (Al) wire bonding is applied to transmit the current from the power chip to external wires. Along with the power increase for the application environments, existing aluminum wires are not suitable for the power chip packaging structure known to the inventor; instead, a metal wire with better electrical conductivity and thermal conductivity, for example, a copper wire, is utilized. However, the change from the aluminum wire to the copper wire is not merely the change of the materials. The experience suitable for the aluminum wire bonding cannot be simply adopted to the copper (Cu) wire bonding. One of the main reasons is that, the mechanical strength of copper is much higher than the mechanical strength of aluminum (the tensile strength of copper is approximately four times of the tensile strength of aluminum). Therefore, as compared with aluminum wire bonding, the copper wire bonding takes a higher wire bonding energy, and the higher wire bonding energy indicates that power chip suffers a higher damage risk during the wire bonding.

SUMMARY

In view of this, the inventor provides a power chip packaging structure. The power chip packaging structure comprises a ceramic substrate, a first top metal layer, a second top metal layer, a bottom metal layer, a power chip, at least one first copper layer, a plurality of second copper layers, and a plurality of wires. The first top metal layer is formed on atop surface of the ceramic substrate. The second top metal layer is formed on the top surface of the ceramic substrate and separated from the first top metal layer. The bottom metal layer is formed on a bottom surface of the ceramic substrate. The power chip has an active surface and a chip back surface. The active surface has a contact pad, and the chip back surface is connected to the first top metal layer. The at least one first copper layer is formed on the contact pad. Atop surface of the at least one first copper layer has a peripheral region and an arrangement region. The peripheral region surrounds the arrangement region, and the peripheral region is defined as a region that extends inward from a periphery of the at least one first copper layer by at least 0.025 mm. The second copper layers are formed in the arrangement region of the at least one first copper layer and separated from each other. A ratio of a thickness of each of the second copper layers to a thickness of the at least one first copper layer is in a range between 2 and 20. One end of two ends of each of the wires is connected to one of the second copper layers, and the other end of each of the wires is connected to the second top metal layer.

In the power chip packaging structure according to one some embodiments of the instant disclosure, at least one first copper layer and a plurality of second copper layers (each of which is thicker than the first copper layer) are sequentially formed on the surface of the contact pad of the power chip. During the wire bonding, the wires (for example, copper wires) are bonded on the second copper layers, therefore the stress which is caused by the wire bonding and instantly applied to the power chip packaging structure is distributed by the second copper layers and the at least one first copper layer. Hence, the power chip can be ensured not to be damaged by the stress caused by the wire bonding.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
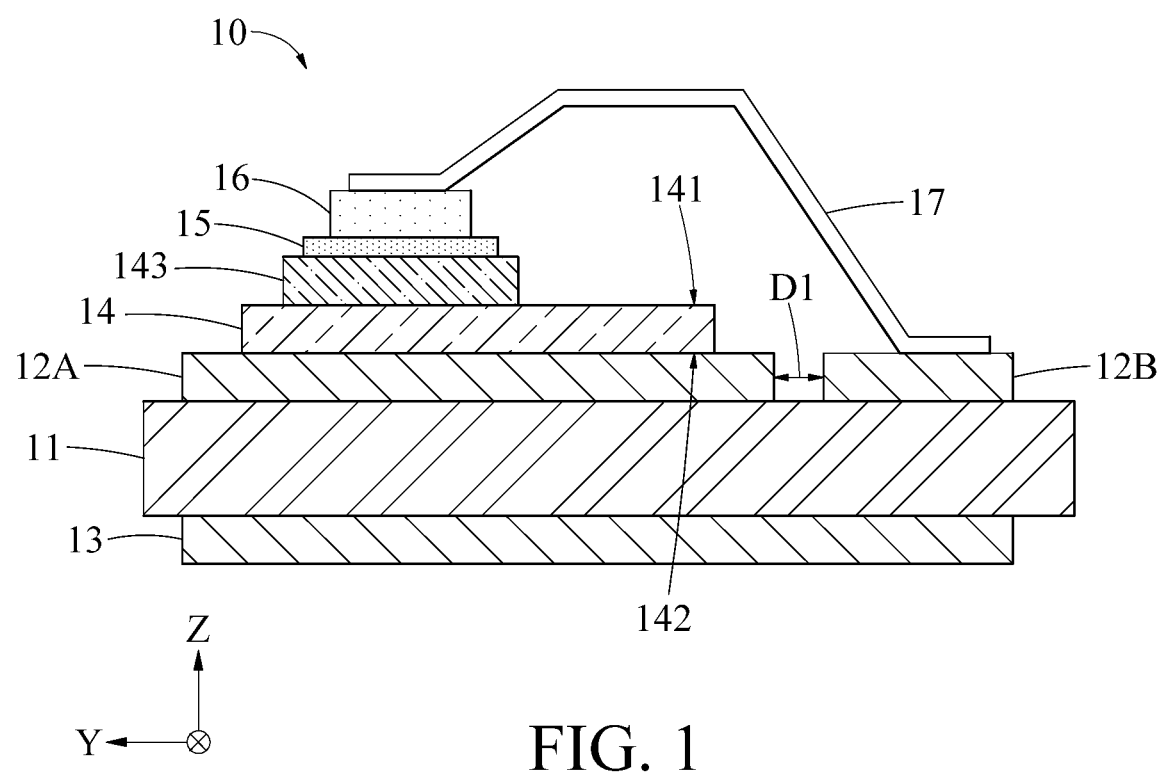
FIG. 1 illustrates a cross-sectional view of an exemplary power chip packaging structure according to the instant disclosure.

FIG. 1 illustrates a cross-sectional view of an exemplary power chip packaging structure 10 according to the instant disclosure. FIG. 2 to FIG. 7 illustrate schematic views of chip packaging structures according to a first embodiment to a sixth embodiment of the instant disclosure; the viewing angle in FIG. 2 to FIG. 7 is equivalent to a partial top view of the power chip packaging structure 10 shown in FIG. 1, which can show the arrangement relationship among the first copper layer 15, the second copper layer 16, and the wire 17. As shown, the power chip packaging structure 10 comprises a ceramic substrate 11 and a power chip 14. A first top metal layer 12A and a second top metal layer 12B are formed on a top surface of the ceramic substrate 11, a distance D1 is existed between the first top metal layer 12A and the second top metal layer 12B, and the distance D1 is substantially in a range between 1.5 and 5 times of a thickness of the first top metal layer 12A (or the second top metal layer 12B). A bottom metal layer 13 is formed on a bottom surface of the ceramic substrate 11. The power chip 14 has an active surface 141 and a chip back surface 142, the active surface 141 has a contact pad 143, and the chip back surface 142 is usually connected to the first top metal layer 12A of the ceramic substrate 11 through soldering. A first copper layer 15 is formed on the contact pad 143 of the power chip 14, and a second copper layer 16 is further formed on the first copper layer 15. Two ends of the wire 17 are fixedly connected to the second copper layer 16 and the second top metal layer 12B through wire bonding. An external device can be electrically connected to the power chip 14 through the electrical connection between the external device and the second top metal layer 12B.

Figure 2:
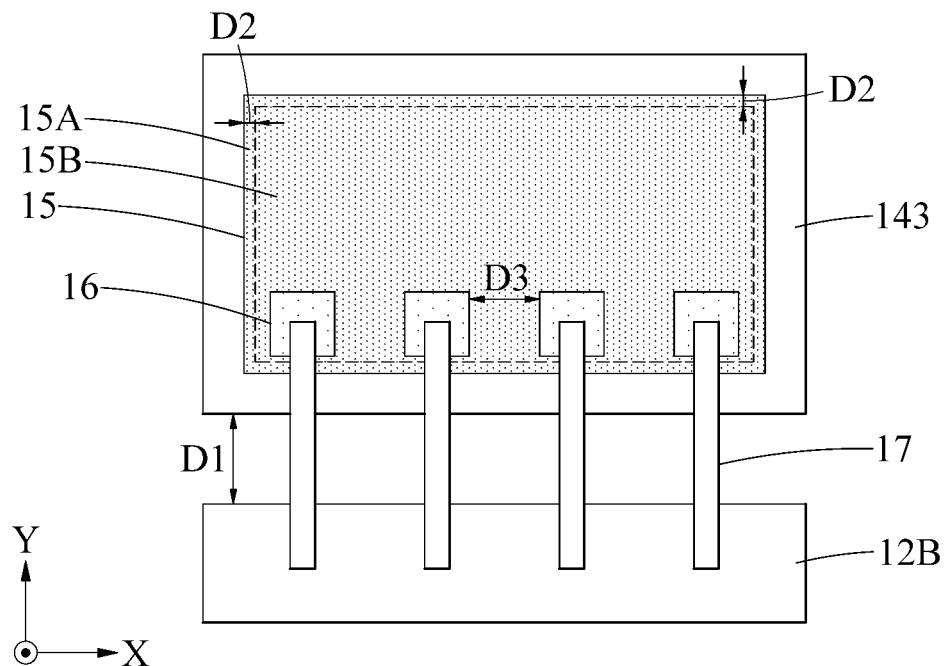
FIG. 2 illustrates a schematic view of a chip packaging structure according to a first embodiment of the instant disclosure.

As shown in FIG. 2, a first copper layer 15 may be formed on the surface of the contact pad 143 of the power chip 14 through electroplating or other metal deposition processes. A top surface of the first copper layer 15 has a peripheral region 15A and an arrangement region 15B, and the peripheral region 15A surrounds the arrangement region 15B. The peripheral region 15A is defined as a region that extends inward from a periphery of the first copper layer 15 by a distance D2, and the distance D2 is at least 0.025 mm (about 1 mil). It should be emphasized that, the dotted lines in FIG. 2 are merely provided for distinguishing the peripheral region 15A from the arrangement region 15B, and the dot lines are not real lines that exist on the first copper layer 15. Next, similarly, a plurality of second copper layers 16 is formed in the arrangement region 15B of the first copper layer 15 through electroplating or other metal deposition processes, and each of the second copper layers 16 is an island structure and separated from one another. Then, through the wire bonding, one of two ends of each of the wires 17 is connected to one of the second copper layers 16, and the other end of each of the wires 17 is connected to the second top metal layer 12. In this embodiment, the purpose of configuring the second copper layers 16 as island structures separated from each other is to reduce the internal stress of the second copper layers 16 applied to the first copper layer 15, thereby increasing the capability of the second copper layers 16 and the first copper layer 15 in absorbing the wire bonding stress.

In this embodiment, a fixed distance D3 is existed between two adjacent of second copper layers 16 to ensure the current is distributed uniformly, for example the distance D3 is 0.1 mm (4 mil). Moreover, the thickness of the second copper layer 16 for directly withstanding the wire bonding stress should be thicker than the thickness of the first copper layer 15, so that the wire bonding stress can be properly distributed to prevent the damage of the power chip 14. Table (1) to Table (3) show the stress distribution performances for the second copper layers 16 and the first copper layer 15 with different thicknesses, where the arrangement relationship between the second copper layers 16 and the first copper layer 15 is shown in FIG. 2 and a total thickness of the second copper layer 16 and the first copper layer 15 in each case is configured as 200 µm, 150 µm, and 100 µm, respectively. The experiment is implemented by, under the fixed copper wire bonding parameters, observing whether the power chip 14 has fractures or cracks and whether the contact pad 143 has deformation or other failure modes after the wire bonding to determine whether the wire bonding stress is properly distributed.

TABLE 1

| Thickness of the second copper layer (µm) | Thickness of the first copper layer (µm) | Stress distribution performance | Total thickness (µm) | Ratio |
|---|---|---|---|---|
| 20 | 180 | Passable | 200 | 0.11 |
| 40 | 160 | Passable | 200 | 0.25 |

TABLE 1-continued

| Thickness of the second copper layer (µm) | Thickness of the first copper layer (µm) | Stress distribution performance | Total thickness (µm) | Ratio |
|---|---|---|---|---|
| 60 | 140 | Passable | 200 | 0.43 |
| 80 | 120 | Passable | 200 | 0.67 |
| 100 | 100 | Good | 200 | 1 |
| 120 | 80 | Good | 200 | 1.5 |
| 140 | 60 | Good | 200 | 2.33 |
| 160 | 40 | Good | 200 | 4 |
| 180 | 20 | Good | 200 | 9 |
| 190 | 10 | Good | 200 | 19 |

TABLE 2

| Thickness of the second copper layer (µm) | Thickness of the first copper layer (µm) | Stress distribution performance | Total thickness (µm) | Ratio |
|---|---|---|---|---|
| 10 | 140 | Not good | 150 | 0.07 |
| 20 | 130 | Not good | 150 | 0.15 |
| 30 | 120 | Not good | 150 | 0.25 |
| 40 | 110 | Not good | 150 | 0.36 |
| 50 | 100 | Not good | 150 | 0.5 |
| 60 | 90 | Not good | 150 | 0.67 |
| 70 | 80 | Not good | 150 | 0.875 |
| 80 | 70 | Passable | 150 | 1.14 |
| 90 | 60 | Passable | 150 | 1.5 |
| 100 | 50 | Good | 150 | 2 |
| 110 | 40 | Good | 150 | 2.75 |
| 120 | 30 | Good | 150 | 4 |
| 130 | 20 | Good | 150 | 6.5 |
| 140 | 10 | Good | 150 | 14 |

TABLE 3

| Thickness of the second copper layer (µm) | Thickness of the first copper layer (µm) | Stress distribution performance | Total thickness (µm) | Ratio |
|---|---|---|---|---|
| 10 | 90 | Not good | 100 | 0.11 |
| 20 | 80 | Not good | 100 | 0.25 |
| 30 | 70 | Not good | 100 | 0.43 |
| 40 | 60 | Not good | 100 | 0.67 |
| 50 | 50 | Not good | 100 | 1 |
| 60 | 40 | Passable | 100 | 1.5 |
| 70 | 30 | Passable | 100 | 2.33 |
| 75 | 25 | Good | 100 | 3 |
| 80 | 20 | Good | 100 | 4 |
| 90 | 10 | Good | 100 | 9 |

As shown in Table (1), in the case that the total thickness of the second copper layer 16 and the first copper layer 15 is 200 µm, when the ratio of the thickness of the second copper layer 16 to the thickness of the first copper layer 15 is greater than or equal to 1, the stress distribution performance is optimal. From the experimental data, even if the ratio of the thickness of the second copper layer 16 to the thickness of the first copper layer 15 is 20, a proper stress distribution performance can be still obtained. As shown in Table (2), in the case that the total thickness of the second copper layer 16 and the first copper layer 15 is 150 µm, when the ratio of the thickness of the second copper layer 16 to the thickness of the first copper layer 15 is greater than or equal to 2, the stress distribution performance is optimal. As shown in Table (3), in the case that the total thickness of the second copper layer 16 and the first copper layer 15 is 100 µm, when the ratio of the thickness of the second copper layer 16 to the thickness of the first copper layer 15 is greater than or equal to 3, the stress distribution performance is optimal. Based on the aforementioned experimental results, under the condition that the total thickness of the first copper layer 15 and the second copper layer 16 is fixed, if the second copper layer 16 is thicker than the first copper layer 15, a better stress distribution performance can be obtained. The primary speculation for the result is that, upon the formation of the first copper layer 15 and the second copper layers 16, the internal stress is retained; moreover, an area of the first copper layer 15 is greater than an area of the second copper layer 16, and the first copper layer 15 is directly formed on the surface of the contact pad 143, therefore, if the first copper layer 15 is thicker than the second copper layer 16, the internal stress applied to the power chip 14 will be bigger, thus causing the power chip 14 to be damaged easily upon withstanding the impact of the wire bonding.

As stated above, in the case that the arrangement relationship between the second copper layers 16 and the first copper layer 15 is shown in FIG. 2, when the ratio of the area of the first copper layer 15 to an area of the contact pad 143 is in a range between 0.5 and 0.95 and the ratio of the area of each of the second copper layers 16 to the area of the first copper layer 15 is in a range between 0.05 and 0.5, the stress distribution performance is optimal.

Figure 3:
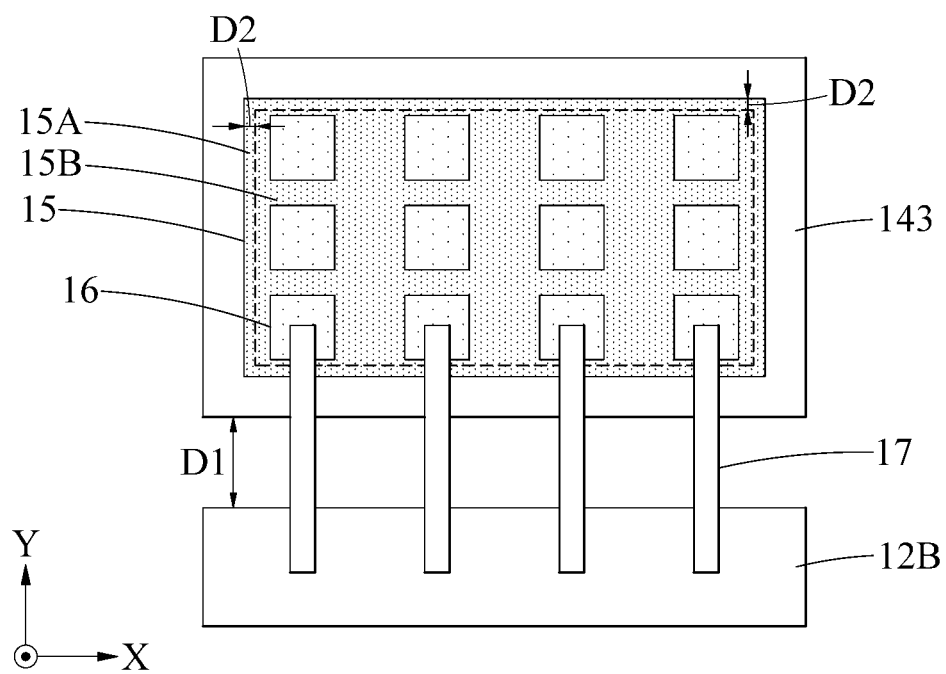
FIG. 3 illustrates a schematic view of a chip packaging structure according to a second embodiment of the instant disclosure.

FIG. 3 illustrates a schematic view of a chip packaging structure according to a second embodiment of the instant disclosure. A major difference between this embodiment and the first embodiment is that, in this embodiment, the chip packaging structure not only comprises second copper layers 16 connected to the wires 17 but also further comprises second copper layers 16 that are not connected to the wires 17. Since a residual stress is generated upon the formation of the second copper layers 16, and the second copper layer 16 is thicker than the first copper layer 15, if the island-structured second copper layers 16 are uniformly distributed over the first copper layer 15, the reliability of the power chip packaging structure 10 for the subsequent thermal cycling tests will be improved.

Table (4) to Table (6) show the stress distribution performances for the second copper layers 16 and the first copper layer 15 with different thicknesses, where the arrangement relationship between the second copper layers 16 and the first copper layer 15 is shown in FIG. 3 and the total thickness of the second copper layer 16 and the first copper layer 15 in each case is configured as 200 μm, 150 μm, and 100 μm, respectively.

TABLE (4)

| Thickness of the second copper layer (μm) | Thickness of the first copper layer (μm) | Stress distribution performance | Total thickness (μm) | Ratio |
|---|---|---|---|---|
| 20 | 180 | Passable | 200 | 0.11 |
| 40 | 160 | Passable | 200 | 0.25 |
| 60 | 140 | Passable | 200 | 0.43 |
| 80 | 120 | Passable | 200 | 0.67 |
| 100 | 100 | Good | 200 | 1 |
| 120 | 80 | Good | 200 | 1.5 |
| 140 | 60 | Good | 200 | 2.33 |
| 160 | 40 | Good | 200 | 4 |
| 180 | 20 | Good | 200 | 9 |
| 190 | 10 | Good | 200 | 19 |

TABLE (5)

| Thickness of the second copper layer (μm) | Thickness of the first copper layer (μm) | Stress distribution performance | Total thickness (μm) | Ratio |
|---|---|---|---|---|
| 10 | 140 | Not good | 150 | 0.07 |
| 20 | 130 | Not good | 150 | 0.15 |
| 30 | 120 | Not good | 150 | 0.25 |
| 40 | 110 | Not good | 150 | 0.36 |
| 50 | 100 | Not good | 150 | 0.5 |
| 60 | 90 | Not good | 150 | 0.67 |
| 70 | 80 | Not good | 150 | 0.875 |
| 80 | 70 | Passable | 150 | 1.14 |
| 90 | 60 | Passable | 150 | 1.5 |
| 100 | 50 | Good | 150 | 2 |
| 110 | 40 | Good | 150 | 2.75 |
| 120 | 30 | Good | 150 | 4 |
| 130 | 20 | Good | 150 | 6.5 |
| 140 | 10 | Good | 150 | 14 |

TABLE (6)

| Thickness of the second copper layer (μm) | Thickness of the first copper layer (μm) | Stress distribution performance | Total thickness (μm) | Ratio |
|---|---|---|---|---|
| 10 | 90 | Not good | 100 | 0.11 |
| 20 | 80 | Not good | 100 | 0.25 |
| 30 | 70 | Not good | 100 | 0.43 |
| 40 | 60 | Not good | 100 | 0.67 |
| 50 | 50 | Not good | 100 | 1 |
| 60 | 40 | Passable | 100 | 1.5 |
| 70 | 30 | Passable | 100 | 2.33 |
| 75 | 25 | Good | 100 | 3 |
| 80 | 20 | Good | 100 | 4 |
| 90 | 10 | Good | 100 | 9 |

As shown in Table (4), in the case that the total thickness of the second copper layer 16 and the first copper layer 15 is 200 μm, when the ratio of the thickness of the second copper layer 16 to the thickness of the first copper layer 15 is greater than or equal to 1, the stress distribution performance is optimal. As shown in Table (5), in the case that the total thickness of the second copper layer 16 and the first copper layer 15 is 150 μm, when the ratio of the thickness of the second copper layer 16 to the thickness of the first copper layer 15 is greater than or equal to 2, the stress distribution performance is optimal. As shown in Table (6), in the case that the total thickness of the second copper layer 16 and the first copper layer 15 is 100 μm, when the ratio of the thickness of the second copper layer 16 to the thickness of the first copper layer 15 is greater than or equal to 3, the stress distribution performance is optimal. The experimental results of Table (4) to Table (6) are consistent with the experimental results of Table (1) to Table (3), that is, under the condition that the total thickness of the first copper layer 15 and the second copper layer 16 is fixed, if the second copper layer 16 is thicker than the first copper layer 15, a better stress distribution performance can be obtained.

As stated above, in the case that the arrangement relationship between the second copper layers 16 and the first copper layer 15 is shown in FIG. 3, when the ratio of the area of the first copper layer 15 to the area of the contact pad 143 is in a range between 0.5 and 0.95 and the ratio of the area of each of the second copper layers 16 to the area of the first copper layer 15 is in a range between 0.05 and 0.25, the stress distribution performance is optimal.

Figure 4:
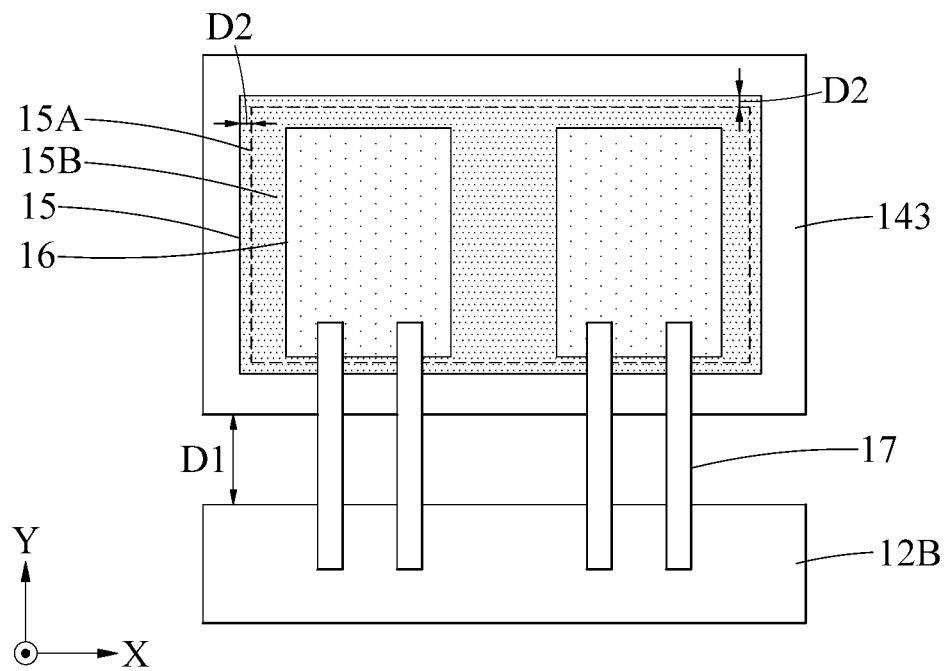
FIG. 4 illustrates a schematic view of a chip packaging structure according to a third embodiment of the instant disclosure.

FIG. 4 illustrates a schematic view of a chip packaging structure according to a third embodiment of the instant disclosure. A major difference between this embodiment and the first embodiment is that, in this embodiment, the second copper layer 16 and the wires 17 do not correspond to each other in a one-to-one relationship; instead, several wires (for example, two wires 17) are connected to a single second copper layer 16. This is because that, upon the formation of the second copper layers 16, the internal stress is retained; moreover, the second copper layer 16 is thicker than the first copper layer 15, therefore, if the island-structured second copper layers 16 are uniformly distributed over the first copper layer 15, the reliability of the power chip packaging structure 10 for the subsequent thermal cycling tests can be increased.

Table (7) to Table (9) show the stress distribution performances for the second copper layers 16 and the first copper layer 15 with different thicknesses, where the arrangement relationship between the second copper layers 16 and the first copper layer 15 is shown in FIG. 4 and the total thickness of the second copper layer 16 and the first copper layer 15 in each case is configured as 200 µm, 150 µm, and 100 µm, respectively.

TABLE (7)

| Thickness of the second copper layer (µm) | Thickness of the first copper layer (µm) | Stress distribution performance | Total thickness (µm) | Ratio |
|---|---|---|---|---|
| 20 | 180 | Passable | 200 | 0.11 |
| 40 | 160 | Passable | 200 | 0.25 |
| 60 | 140 | Passable | 200 | 0.43 |
| 80 | 120 | Passable | 200 | 0.67 |
| 100 | 100 | Good | 200 | 1 |
| 120 | 80 | Good | 200 | 1.5 |
| 140 | 60 | Good | 200 | 2.33 |
| 160 | 40 | Good | 200 | 4 |
| 180 | 20 | Good | 200 | 9 |
| 190 | 10 | Good | 200 | 19 |

TABLE (8)

| Thickness of the second copper layer (µm) | Thickness of the first copper layer (µm) | Stress distribution performance | Total thickness (µm) | Ratio |
|---|---|---|---|---|
| 10 | 140 | Not good | 150 | 0.07 |
| 20 | 130 | Not good | 150 | 0.15 |
| 30 | 120 | Not good | 150 | 0.25 |
| 40 | 110 | Not good | 150 | 0.36 |
| 50 | 100 | Not good | 150 | 0.5 |
| 60 | 90 | Not good | 150 | 0.67 |
| 70 | 80 | Passable | 150 | 0.875 |
| 80 | 70 | Passable | 150 | 1.14 |
| 90 | 60 | Good | 150 | 1.5 |
| 100 | 50 | Good | 150 | 2 |
| 110 | 40 | Good | 150 | 2.75 |
| 120 | 30 | Good | 150 | 4 |
| 130 | 20 | Good | 150 | 6.5 |
| 140 | 10 | Good | 150 | 14 |

TABLE (9)

| Thickness of the second copper layer (µm) | Thickness of the first copper layer (µm) | Stress distribution performance | Total thickness (µm) | Ratio |
|---|---|---|---|---|
| 10 | 90 | Not good | 100 | 0.11 |
| 20 | 80 | Not good | 100 | 0.25 |
| 30 | 70 | Not good | 100 | 0.43 |
| 40 | 60 | Not good | 100 | 0.67 |
| 50 | 50 | Passable | 100 | 1 |
| 60 | 40 | Passable | 100 | 1.5 |
| 70 | 30 | Good | 100 | 2.33 |
| 75 | 25 | Good | 100 | 3 |
| 80 | 20 | Good | 100 | 4 |
| 90 | 10 | Good | 100 | 9 |

As shown in Table (7), in the case that the total thickness of the second copper layer 16 and the first copper layer 15 is 200 µm, when the ratio of the thickness of the second copper layer 16 to the thickness of the first copper layer 15 is greater than or equal to 1, the stress distribution performance is optimal. As shown in Table (8), in the case that the total thickness of the second copper layer 16 and the first copper layer 15 is 150 µm, when the ratio of the thickness of the second copper layer 16 to the thickness of the first copper layer 15 is greater than or equal to 1.5, the stress distribution performance is optimal. As shown in Table (9), in the case that the total thickness of the second copper layer 16 and the first copper layer 15 is 100 µm, when the ratio of the thickness of the second copper layer 16 to the thickness of the first copper layer 15 is greater than or equal to 2.33, the stress distribution performance is optimal. The experimental results of Table (7) to Table (9) are consistent with the experimental results of Table (1) to Table (6), that is, under the condition that the total thickness of the first copper layer 15 and the second copper layer 16 is fixed, if the second copper layer 16 is thicker than the first copper layer 15, a better stress distribution performance can be obtained.

As stated above, in the case that the arrangement relationship between the second copper layers 16 and the first copper layer 15 is shown in FIG. 4, when the ratio of the area of the first copper layer 15 to the area of the contact pad 143 is in a range between 0.5 and 0.95 and the ratio of the area of each of the second copper layers 16 to the area of the first copper layer 15 is in a range between 0.05 and 0.5, the stress distribution performance is optimal.

Figure 5:
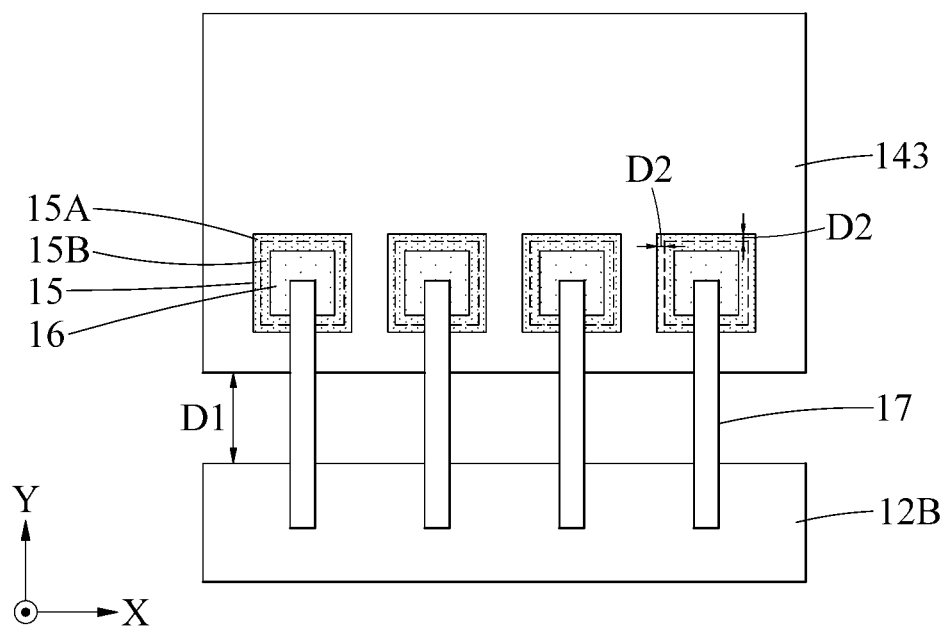
FIG. 5 illustrates a schematic view of a chip packaging structure according to a fourth embodiment of the instant disclosure.

FIG. 5 illustrates a schematic view of a chip packaging structure according to a fourth embodiment of the instant disclosure. A major difference between this embodiment and the first embodiment is that, in this embodiment, the chip packaging structure comprises a plurality of island-structured first copper layers 15, and the number of the first copper layers 15, the number of the second copper layers 16, and the number of the wires 17 are the same. Each of the first copper layers 15 corresponds to a corresponding one of the second copper layers 16, each of the second copper layers 16 corresponds to a corresponding one of the wires 17, and the area of each of the first copper layers 15 is greater than the area of the corresponding one of the second copper layers 16. The one end of each of the wires 17 is connected to the corresponding one of the second copper layers 16, and the other end of each of the wires 17 is connected to the second top metal layer 12B. In this embodiment, the first copper layers 15 are also configured as island structures. Therefore, the internal stress of the first copper layers 15 applied to the contact pad 143 can be reduced, so that the reliability of the power chip packaging structure 10 for the subsequent thermal cycling tests can be increased.

Table (10) to Table (12) show the stress distribution performances for the second copper layers 16 and the first copper layers 15 with different thicknesses, where the arrangement relationship between the second copper layers 16 and the first copper layers 15 is shown in FIG. 5 and the total thickness of the second copper layer 16 and the first copper layer 15 in each case is configured as 200 μm, 150 μm, and 100 μm, respectively.

TABLE (10)

| Thickness of the second copper layer (μm) | Thickness of the first copper layer (μm) | Stress distribution performance | Total thickness (μm) | Ratio |
|---|---|---|---|---|
| 20 | 180 | Passable | 200 | 0.11 |
| 40 | 160 | Passable | 200 | 0.25 |
| 60 | 140 | Passable | 200 | 0.43 |
| 80 | 120 | Passable | 200 | 0.67 |
| 100 | 100 | Passable | 200 | 1 |
| 120 | 80 | Good | 200 | 1.5 |
| 140 | 60 | Good | 200 | 2.33 |
| 160 | 40 | Good | 200 | 4 |
| 180 | 20 | Good | 200 | 9 |
| 190 | 10 | Good | 200 | 19 |

TABLE (11)

| Thickness of the second copper layer (μm) | Thickness of the first copper layer (μm) | Stress distribution performance | Total thickness (μm) | Ratio |
|---|---|---|---|---|
| 10 | 140 | Not good | 150 | 0.07 |
| 20 | 130 | Not good | 150 | 0.15 |
| 30 | 120 | Not good | 150 | 0.25 |
| 40 | 110 | Not good | 150 | 0.36 |
| 50 | 100 | Not good | 150 | 0.5 |
| 60 | 90 | Not good | 150 | 0.67 |
| 70 | 80 | Not good | 150 | 0.875 |
| 80 | 70 | Not good | 150 | 1.14 |
| 90 | 60 | Passable | 150 | 1.5 |
| 100 | 50 | Good | 150 | 2 |
| 110 | 40 | Good | 150 | 2.75 |
| 120 | 30 | Good | 150 | 4 |
| 130 | 20 | Good | 150 | 6.5 |
| 140 | 10 | Good | 150 | 14 |

TABLE (12)

| Thickness of the second copper layer (μm) | Thickness of the first copper layer (μm) | Stress distribution performance | Total thickness (μm) | Ratio |
|---|---|---|---|---|
| 10 | 90 | Not good | 100 | 0.11 |
| 20 | 80 | Not good | 100 | 0.25 |
| 30 | 70 | Not good | 100 | 0.43 |
| 40 | 60 | Not good | 100 | 0.67 |
| 50 | 50 | Not good | 100 | 1 |
| 60 | 40 | Not good | 100 | 1.5 |
| 70 | 30 | Passable | 100 | 2.33 |
| 75 | 25 | Passable | 100 | 3 |
| 80 | 20 | Good | 100 | 4 |
| 90 | 10 | Good | 100 | 9 |

As shown in Table (10), in the case that the total thickness of the second copper layer 16 and the first copper layer 15 is 200 μm, when the ratio of the thickness of the second copper layer 16 to the thickness of the first copper layer 15 is greater than or equal to 1.5, the stress distribution performance is optimal. As shown in Table (11), in the case that the total thickness of the second copper layer 16 and the first copper layer 15 is 150 μm, when the ratio of the thickness of the second copper layer 16 to the thickness of the first copper layer 15 is greater than or equal to 2, the stress distribution performance is optimal. As shown in Table (12), in the case that the total thickness of the second copper layer 16 and the first copper layer 15 is 100 μm, when the ratio of the thickness of the second copper layer 16 to the thickness of the first copper layer 15 is greater than or equal to 4, the stress distribution performance is optimal. The experimental results of Table (10) to Table (12) are consistent with the experimental results of Table (1) to Table (9), that is, under the condition that the total thickness of the first copper layer 15 and the second copper layer 16 is fixed, if the second copper layer 16 is thicker than the first copper layer 15, a better stress distribution performance can be obtained.

As stated above, in the case that the arrangement relationship between the second copper layers 16 and the first copper layers 15 is shown in FIG. 5, when the ratio of the area of the first copper layer 15 to the area of the contact pad 143 is in a range between 0.05 and 0.5 and the ratio of the area of each of the second copper layers 16 to the area of each of the first copper layers 15 is in a range between 0.5 and 0.95, the stress distribution performance is optimal.

Figure 6:
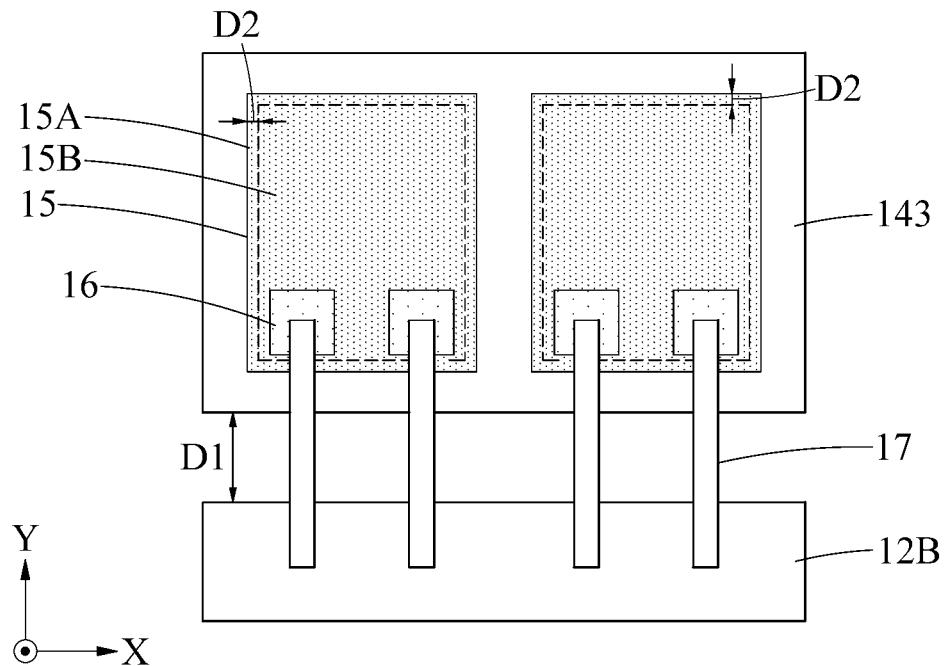
FIG. 6 illustrates a schematic view of a chip packaging structure according to a fifth embodiment of the instant disclosure.

FIG. 6 illustrates a schematic view of a chip packaging structure according to a fifth embodiment of the instant disclosure. A major difference between this embodiment and the first embodiment is that, in this embodiment, the chip packaging structure comprises a plurality of island-structured first copper layers 15 (in the figure, two first copper layers 15 are illustrated), at least two of the second copper layers 16 are formed on a corresponding one of the first copper layers 15, and the number of the second copper layers 16 is the same as the number of the wires 17. Each of the second copper layers 16 corresponds to a corresponding one of the wires 17, the one end of each of the wires 17 is connected to a corresponding one of the second copper layers 16, and the other end of each of the wires 17 is connected to the second top metal layer 12B.

Table (13) to Table (15) show the stress distribution performances for the second copper layers 16 and the first copper layers 15 with different thicknesses, where the arrangement relationship between the second copper layers 16 and the first copper layers 15 is shown in FIG. 6 and the total thickness of the second copper layer 16 and the first copper layer 15 in each case is configured as 200 μm, 150 μm, and 100 μm, respectively.

TABLE (13)

| Thickness of the second copper layer (μm) | Thickness of the first copper layer (μm) | Stress distribution performance | Total thickness (μm) | Ratio |
|---|---|---|---|---|
| 20 | 180 | Passable | 200 | 0.11 |
| 40 | 160 | Passable | 200 | 0.25 |
| 60 | 140 | Passable | 200 | 0.43 |
| 80 | 120 | Passable | 200 | 0.67 |
| 100 | 100 | Good | 200 | 1 |
| 120 | 80 | Good | 200 | 1.5 |
| 140 | 60 | Good | 200 | 2.33 |
| 160 | 40 | Good | 200 | 4 |
| 180 | 20 | Good | 200 | 9 |
| 190 | 10 | Good | 200 | 19 |

TABLE (14)

| Thickness of the second copper layer (μm) | Thickness of the first copper layer (μm) | Stress distribution performance | Total thickness (μm) | Ratio |
|---|---|---|---|---|
| 10 | 140 | Not good | 150 | 0.07 |
| 20 | 130 | Not good | 150 | 0.15 |
| 30 | 120 | Not good | 150 | 0.25 |
| 40 | 110 | Not good | 150 | 0.36 |
| 50 | 100 | Not good | 150 | 0.5 |
| 60 | 90 | Not good | 150 | 0.67 |
| 70 | 80 | Not good | 150 | 0.875 |
| 80 | 70 | Passable | 150 | 1.14 |

TABLE (14)-continued

| Thickness of the second copper layer (μm) | Thickness of the first copper layer (μm) | Stress distribution performance | Total thickness (μm) | Ratio |
|---|---|---|---|---|
| 90 | 60 | Passable | 150 | 1.5 |
| 100 | 50 | Good | 150 | 2 |
| 110 | 40 | Good | 150 | 2.75 |
| 120 | 30 | Good | 150 | 4 |
| 130 | 20 | Good | 150 | 6.5 |
| 140 | 10 | Good | 150 | 14 |

TABLE (15)

| Thickness of the second copper layer (μm) | Thickness of the first copper layer (μm) | Stress distribution performance | Total thickness (μm) | Ratio |
|---|---|---|---|---|
| 10 | 90 | Not good | 100 | 0.11 |
| 20 | 80 | Not good | 100 | 0.25 |
| 30 | 70 | Not good | 100 | 0.43 |
| 40 | 60 | Not good | 100 | 0.67 |
| 50 | 50 | Not good | 100 | 1 |
| 60 | 40 | Passable | 100 | 1.5 |
| 70 | 30 | Passable | 100 | 2.33 |
| 75 | 25 | Good | 100 | 3 |
| 80 | 20 | Good | 100 | 4 |
| 90 | 10 | Good | 100 | 9 |

As shown in Table (13), in the case that the total thickness of the second copper layer 16 and the first copper layer 15 is 200 μm, when the ratio of the thickness of the second copper layer 16 to the thickness of the first copper layer 15 is greater than or equal to 1, the stress distribution performance is optimal. As shown in Table (14), in the case that the total thickness of the second copper layer 16 and the first copper layer 15 is 150 μm, when the ratio of the thickness of the second copper layer 16 to the thickness of the first copper layer 15 is greater than or equal to 2, the stress distribution performance is optimal. As shown in Table (15), in the case that the total thickness of the second copper layer 16 and the first copper layer 15 is 100 μm, when the ratio of the thickness of the second copper layer 16 to the thickness of the first copper layer 15 is greater than or equal to 3, the stress distribution performance is optimal. The experimental results of Table (13) to Table (15) are consistent with the experimental results of Table (1) to Table (12), that is, under the condition that the total thickness of the first copper layer 15 and the second copper layer 16 is fixed, if the second copper layer 16 is thicker than the first copper layer 15, a better stress distribution performance can be obtained.

As stated above, in the case that the arrangement relationship between the second copper layers 16 and the first copper layers 15 is shown in FIG. 6, when the ratio of the area of the first copper layer 15 to the area of the contact pad 143 is in a range between 0.2 and 0.5 and the ratio of the area of each of the second copper layers 16 to the area of each of the first copper layers 15 is in a range between 0.05 and 0.4, the stress distribution performance is optimal.

Figure 7:
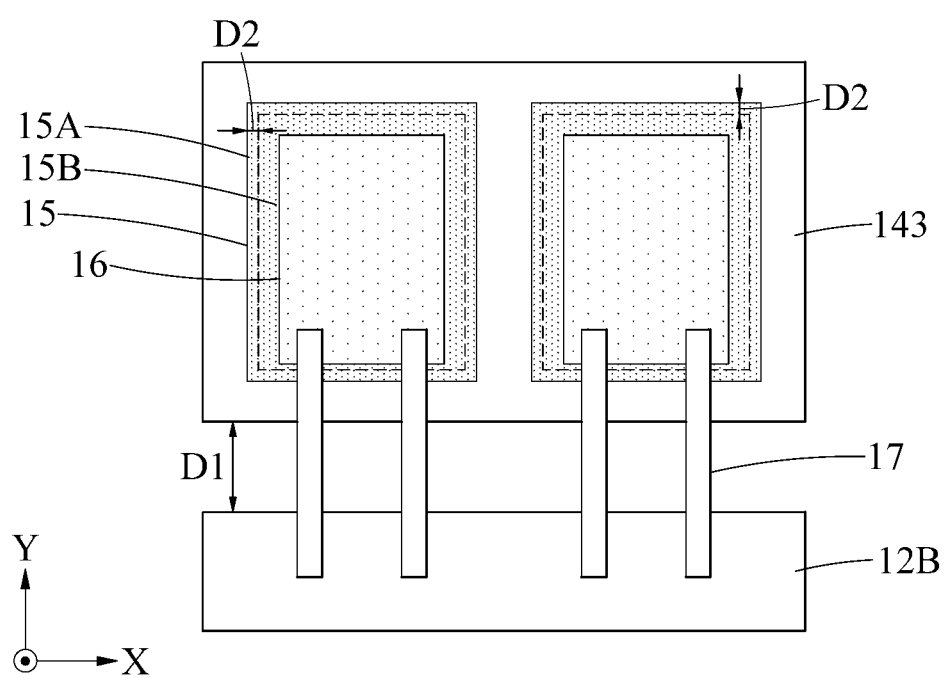
FIG. 7 illustrates a schematic view of a chip packaging structure according to a sixth embodiment of the instant disclosure.

FIG. 7 illustrates a schematic view of a chip packaging structure according to a fifth embodiment of the instant disclosure. A major difference between this embodiment and the first embodiment is that, in this embodiment, the chip packaging structure comprises a plurality of island-structured first copper layers 15 (in the figure, two first copper layers 15 are illustrated), the number of the first copper layers 15 is equal to the number of the second copper layer 16, each of the first copper layers 15 corresponds to a corresponding one of the second copper layers 16, each of the second copper layers 16 corresponds to a corresponding one of the wires 17, and the number of the second copper layers 16 is less than the number of the wires 17. Each of the second copper layers 16 corresponds to the same number of the wires 17, the one end of each of at least two of the wires 17 is connected to a corresponding one of the second copper layers 16, and the other end of each of the wires 17 is connected to the second top metal layer 12B.

Table (16) to Table (18) show the stress distribution performances for the second copper layers 16 and the first copper layers 15 with different thicknesses, where the arrangement relationship between the second copper layers 16 and the first copper layers 15 is shown in FIG. 7 and the total thickness of the second copper layer 16 and the first copper layer 15 in each case is configured as 200 μm, 150 μm, and 100 μm, respectively.

TABLE (16)

| Thickness of the second copper layer (μm) | Thickness of the first copper layer (μm) | Stress distribution performance | Total thickness (μm) | Ratio |
|---|---|---|---|---|
| 20 | 180 | Passable | 200 | 0.11 |
| 40 | 160 | Passable | 200 | 0.25 |
| 60 | 140 | Passable | 200 | 0.43 |
| 80 | 120 | Passable | 200 | 0.67 |
| 100 | 100 | Good | 200 | 1 |
| 120 | 80 | Good | 200 | 1.5 |
| 140 | 60 | Good | 200 | 2.33 |
| 160 | 40 | Good | 200 | 4 |
| 180 | 20 | Good | 200 | 9 |
| 190 | 10 | Good | 200 | 19 |

TABLE (17)

| Thickness of the second copper layer (μm) | Thickness of the first copper layer (μm) | Stress distribution performance | Total thickness (μm) | Ratio |
|---|---|---|---|---|
| 10 | 140 | Not good | 150 | 0.07 |
| 20 | 130 | Not good | 150 | 0.15 |
| 30 | 120 | Not good | 150 | 0.25 |
| 40 | 110 | Not good | 150 | 0.36 |
| 50 | 100 | Not good | 150 | 0.5 |
| 60 | 90 | Not good | 150 | 0.67 |
| 70 | 80 | Passable | 150 | 0.875 |
| 80 | 70 | Passable | 150 | 1.14 |
| 90 | 60 | Good | 150 | 1.5 |
| 100 | 50 | Good | 150 | 2 |
| 110 | 40 | Good | 150 | 2.75 |
| 120 | 30 | Good | 150 | 4 |
| 130 | 20 | Good | 150 | 6.5 |
| 140 | 10 | Good | 150 | 14 |

TABLE (18)

| Thickness of the second copper layer (μm) | Thickness of the first copper layer (μm) | Stress distribution performance | Total thickness (μm) | Ratio |
|---|---|---|---|---|
| 10 | 90 | Not good | 100 | 0.11 |
| 20 | 80 | Not good | 100 | 0.25 |
| 30 | 70 | Not good | 100 | 0.43 |
| 40 | 60 | Not good | 100 | 0.67 |
| 50 | 50 | Passable | 100 | 1 |
| 60 | 40 | Passable | 100 | 1.5 |
| 70 | 30 | Good | 100 | 2.33 |
| 75 | 25 | Good | 100 | 3 |
| 80 | 20 | Good | 100 | 4 |
| 90 | 10 | Good | 100 | 9 |

As shown in Table (16), in the case that the total thickness of the second copper layer 16 and the first copper layer 15 is 200 µm, when the ratio of the thickness of the second copper layer 16 to the thickness of the first copper layer 15 is greater than or equal to 1, the stress distribution performance is optimal. As shown in Table (17), in the case that the total thickness of the second copper layer 16 and the first copper layer 15 is 150 µm, when the ratio of the thickness of the second copper layer 16 to the thickness of the first copper layer 15 is greater than or equal to 1.5, the stress distribution performance is optimal. As shown in Table (18), in the case that the total thickness of the second copper layer 16 and the first copper layer 15 is 100 µm, when the ratio of the thickness of the second copper layer 16 to the thickness of the first copper layer 15 is greater than or equal to 2.33, the stress distribution performance is optimal. The experimental results of Table (16) to Table (18) are consistent with the experimental results of Table (1) to Table (15), that is, under the condition that the total thickness of the first copper layer 15 and the second copper layer 16 is fixed, if the second copper layer 16 is thicker than the first copper layer 15, a better stress distribution performance can be obtained.

As stated above, in the case that the arrangement relationship between the second copper layers 16 and the first copper layers 15 is shown in FIG. 7, when the ratio of the area of the first copper layer 15 to the area of the contact pad 143 is in a range between 0.2 and 0.5 and the ratio of the area of each of the second copper layers 16 to the area of each of the first copper layers 15 is in a range between 0.5 and 0.95, the stress distribution performance is optimal.

In the aforementioned embodiments, the material of the first top metal layer 12A, the second top metal layer 12B, the bottom metal layer 13 of the ceramic substrate 11 is copper. In other embodiments, the material of the first top metal layer 12A, the second top metal layer 12B, the bottom metal layer 13 of the ceramic substrate 11 may be gold, silver, aluminum, or alloys thereof.

In the aforementioned embodiments, the term "distance" indicates the shortest distance between edges of two adjacent objects.

It is understood that the use of terms "top/upper" or "bottom/lower" in the contents of the description is only for the purpose of illustrating the technical contents of the disclosed embodiments or the relative relationships of the components, and is not intended to limit the absolute spatial position of the components. In other words, the embodiments illustrated in the description and drawings are provided to allow a person having ordinary skills in the art to realize the invention and are not provided to limit the claim scopes of the invention.

What is claimed is:

1. A power chip packaging structure comprising:
   a ceramic substrate;
   a first top metal layer formed on a top surface of the ceramic substrate;
   a second top metal layer formed on the top surface of the ceramic substrate and separated from the first top metal layer;
   a bottom metal layer formed on a bottom surface of the ceramic substrate;
   a power chip having an active surface and a chip back surface, wherein the active surface has a contact pad, and the chip back surface is connected to the first top metal layer;
   at least one first copper layer formed on the contact pad, wherein a top surface of the at least one first copper layer has a peripheral region and an arrangement region, the peripheral region surrounds the arrangement region, and the peripheral region is defined as a region that extends inward from a periphery of the at least one first copper layer by at least 0.025 mm;
   a plurality of second copper layers formed in the arrangement region of the at least one first copper layer and separated from each other, wherein a ratio of a thickness of each of the second copper layers to a thickness of the at least one first copper layer is in a range between 2 and 20; and
   a plurality of wires, wherein one end of two ends of each of the wires is connected to one of the second copper layers, and the other end of each of the wires is connected to the second top metal layer.

2. The power chip package structure according to claim 1, wherein the number of the at least one first copper layer is one, the number of the second copper layers is the same as the number of the wires, each of the second copper layers corresponds to a corresponding one of the wires, the one end of each of the wires is connected to the corresponding one of the second copper layers, and the other end of each of the wires is connected to the second top metal layer.

3. The power chip package structure according to claim 2, wherein a ratio of an area of the first copper layer to an area of the contact pad is in a range between 0.5 and 0.95, and a ratio of an area of each of the second copper layers to the area of the first copper layer is in a range between 0.05 and 0.5.

4. The power chip package structure according to claim 2, wherein a distance between two of the second copper layers adjacent to each other is greater than or equal to 0.1 mm.

5. The power chip package structure according to claim 1, wherein the number of the at least one first copper layer is one, the number of the second copper layers is less than the number of the wires, each of the second copper layers corresponds to one of the wires, the one end of each of the wires is connected to the one of the second copper layers, and the other end of each of the wires is connected to the second top metal layer.

6. The power chip package structure according to claim 5, wherein a ratio of an area of the first copper layer to an area of the contact pad is in a range between 0.5 and 0.95, and a ratio of an area of each of the second copper layers to the area of the first copper layer is in a range between 0.05 and 0.25.

7. The power chip package structure according to claim 5 wherein a distance between two of the second copper layers adjacent to each other is greater than or equal to 0.1 mm.

8. The power chip package structure according to claim 1, wherein the number of the at least one first copper layer is one, the number of the second copper layers is less than the number of the wires, each of the second copper layers corresponds the same number of the wires, the one end of each of at least two of the wires is connected to a corresponding one of the second copper layers, and the other end of each of the wires is connected to the second top metal layer.

9. The power chip package structure according to claim 8, wherein a ratio of an area of the first copper layer to an area of the contact pad is in a range between 0.5 and 0.95, and a ratio of an area of each of the second copper layers to the area of the first copper layer is in a range between 0.05 and 0.5.

10. The power chip package structure according to claim 8, wherein a distance between two of the second copper layers adjacent to each other is greater than or equal to 0.1 mm.

11. The power chip package structure according to claim 1, wherein the number of the at least one first copper layer is more than one, the number of the first copper layers, the number of the second copper layers, and the number of the wires are the same, each of the first copper layers corresponds to a corresponding one of the second copper layers, each of the second copper layers corresponds to a corresponding one of the wires, an area of each of the first copper layers is greater than an area of the corresponding one of the second copper layers, the one end of the each of the wires is connected to the corresponding one of the second copper layers, and the other end of each of the wires is connected to the second top metal layer.

12. The power chip package structure according to claim 11, wherein a ratio of an area of the first copper layer to an area of the contact pad is in a range between 0.05 and 0.5, and a ratio of an area of each of the second copper layers to the area of the first copper layer is in a range between 0.5 and 0.95.

13. The power chip package structure according to claim 11, wherein a distance between two of the second copper layers adjacent to each other is greater than or equal to 0.1 mm.

14. The power chip package structure according to claim 1, wherein the number of the at least one first copper layer is more than one, at least two of the second copper layers are formed on a corresponding one of the first copper layers, the number of the second copper layers is the same as the number of the wires, each of the second copper layers corresponds to a corresponding one of the wires, the one end of each of the wires is connected to a corresponding one of the second copper layers, and the other end of each of the wires is connected to the second top metal layer.

15. The power chip package structure according to claim 14, wherein a ratio of an area of the first copper layer to an area of the contact pad is in a range between 0.2 and 0.5, and a ratio of an area of each of the second copper layers to the area of the first copper layer is in a range between 0.05 and 0.4.

16. The power chip package structure according to claim 14, wherein a distance between two of the second copper layers adjacent to each other is greater than or equal to 0.1 mm.

17. The power chip package structure according to claim 1, wherein the number of the at least one first copper layer is equal to the number of the second copper layers, each of the first copper layers corresponds to a corresponding one of the second copper layers, the number of the second copper layers is less than the number of the wires, each of the second copper layers corresponds the same number of the wires, the one end of each of at least two of the wires is connected to a corresponding one of the second copper layers, and the other end of each of the wires is connected to the second top metal layer.

18. The power chip package structure according to claim 17, wherein a ratio of an area of the first copper layer to an area of the contact pad is in a range between 0.2 and 0.5, and a ratio of an area of each of the second copper layers to the area of the first copper layer is in a range between 0.5 and 0.95.

19. The power chip package structure according to claim 17, wherein a distance between two of the second copper layers adjacent to each other is greater than or equal to 0.1 mm.

20. The power chip package structure according to claim 1, wherein a distance between two of the second copper layers adjacent to each other is greater than or equal to 0.1 mm.

* * * * *